United States Patent
Mariani et al.

(10) Patent No.: US 9,697,913 B1
(45) Date of Patent: Jul. 4, 2017

(54) FERROELECTRIC MEMORY CELL RECOVERY

(71) Applicant: Micron Technology, Inc., Boise, ID (US)

(72) Inventors: Marcello Mariani, Milan (IT); Giorgio Servalli, Fara Gera d'Adda (IT); Andrea Locatelli, Dalmine (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/179,695

(22) Filed: Jun. 10, 2016

(51) Int. Cl.
*G11C 11/22* (2006.01)
*G11C 29/50* (2006.01)

(52) U.S. Cl.
CPC .... *G11C 29/50004* (2013.01); *G11C 11/2253* (2013.01); *G11C 11/2273* (2013.01); *G11C 11/2275* (2013.01); *G11C 11/2293* (2013.01); *G11C 11/2297* (2013.01)

(58) Field of Classification Search
CPC .... G11C 11/22; G11C 11/406; G11C 11/2273
See application file for complete search history.

(56) References Cited

U.S. PATENT DOCUMENTS

| 5,381,379 | A | * | 1/1995 | Fukumoto | G11C 7/00 365/145 |
|---|---|---|---|---|---|
| 2001/0040814 | A1 | * | 11/2001 | Takashima | G11C 11/22 365/145 |
| 2007/0025172 | A1 | * | 2/2007 | Miyamoto | G11C 11/406 365/222 |
| 2012/0147654 | A1 | * | 6/2012 | Qidwai | G11C 11/22 365/145 |
| 2014/0029326 | A1 | * | 1/2014 | Qidwai | G11C 11/2273 365/145 |
| 2016/0276028 | A1 | * | 9/2016 | Wells | G11O 5/02 |

OTHER PUBLICATIONS

Colla et al., "DC-voltage and cycling induced recovery of switched polarisation in fatigued ferroelectric thin films," Integrated Ferroelectrics, 1995, 289-294, vol. 10., 1995 OPA Amsterdam B.V., The Netherlands.

(Continued)

*Primary Examiner* — Tuan T Nguyen
(74) *Attorney, Agent, or Firm* — Holland & Hart LLP

(57) ABSTRACT

Methods, systems, and devices for recovering fatigued ferroelectric memory cells are described. Recovery voltages may be applied to a ferroelectric memory cell that is fatigued due to repeated access (read or write) operations. The recovery voltage may have a greater amplitude than the access voltage and may include multiple voltage pulses or a constant voltage. The recovery operation may be performed in the background as the memory array operates, or it may be performed when a host device is not actively using the memory array. The recovery operations may be performed periodically or may include discrete series of pulses distributed among several instances.

26 Claims, 9 Drawing Sheets

(56) References Cited

OTHER PUBLICATIONS

Ozgul et al., "Influence of electrical cycling on polarization reversal processes in $Pb(Zn_{1/3}Nb_{2/3})O_3$-$PbTiO_3$ ferroelectric single crystals as a function of orientation," Journal of Applied Physics, Apr. 15, 2004, 8pgs. vol. 95, No. 8, 2004 American Institute of Physics.
Pawlaczyk et al., "Fatigue, rejuvenation and self-restoring in ferroelectric thin films," Integrated Ferroelectrics, 1995, 293-316, vol. 8, 1995 OPA Amseterdam B.V., The Netherlands.
Schloss et al., "Polarization recovery of fatigued $Pb(Zr,Ti)O_3$ thin films: Switching current studies," Journal of Applied Physics, Feb. 1, 2003, 6 pgs. vol. 93, No. 3, American Institute of Physics.

\* cited by examiner

FERROELECTRIC MEMORY CELL RECOVERY

BACKGROUND

The following relates generally to memory devices and more specifically to recovery of fatigued ferroelectric memory cells.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. The performance of FeRAM cells may degrade over their lifetime, however. For example, the ferroelectric material may experience fatigue due to the read or write operations performed on the memory cell during normal operation. A fatigued ferroelectric material may reduce the FeRAM cell's ability to store charge, which may make the memory cell inoperable.

BRIEF DESCRIPTION OF THE DRAWINGS

The disclosure herein refers to and includes the following figures.

DETAILED DESCRIPTION

Fatigued ferroelectric memory cells, including those suffering from cycling-induced fatigue, may be recovered by applying a recovery voltage to the memory cells. The recovery voltage may have a greater amplitude than the cycling voltage (e.g., the voltages used to read or write a memory cell). The recovery voltages may include multiple voltage pulses or a constant voltage stress. In order to minimize interruptions of a host device's operation, the recovery operation may be applied during times when the memory device is not in use by the host device, and the recovery operation may be distributed, or broken up, over time. For example, the recovery operation may be performed while the host device is powering on or off, or it may occur in the background while the memory array is idle.

Cycling-induced fatigue may decrease a ferroelectric memory cell's remnant polarization, which is the polarization that remains after reading or writing the memory cell. Since the charge stored in a ferroelectric memory cell is proportional to its remnant polarization, less charge is stored in the memory cell as the remnant polarization decreases. If the remnant polarization drops below a threshold, the memory array may not be able to read the logic value of the fatigued memory cell. That is, the memory array may not be sufficiently sensitive to determine the logic state based on the decreased charge. As a result, the memory cell may be considered inoperable or dead.

A recovery operation may counteract fatigue by restoring the remnant polarization of the memory cell. For example, an applied recovery voltage may improve or restore the ferroelectric material's remnant polarization. The effectiveness of the recovery operation may depend on the amplitude of the recovery voltage and its duration. In some examples, the recovery operation may include bipolar voltage pulses, unipolar voltage pulses, or a constant voltage.

Features of the disclosure introduced above are further described below in the context of a memory array. Specific examples are then described for recovery of fatigued ferroelectric memory cells and various implementations of such recovery operations. These and other features of the disclosure are further illustrated by and described with reference to apparatus diagrams, system diagrams, and flowcharts that relate to recovery of fatigued ferroelectric memory cells.

Figure 1:
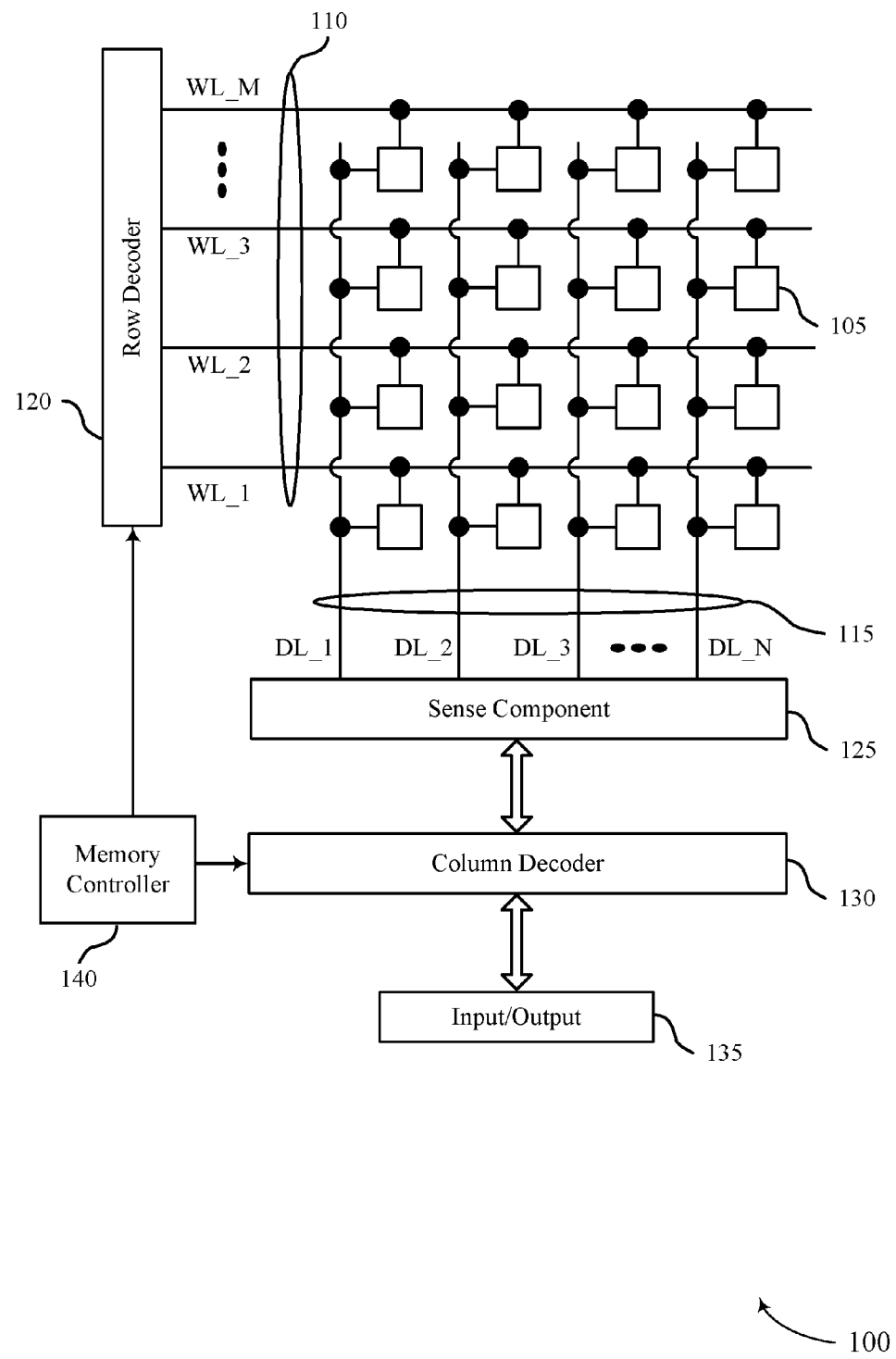
FIG. 1 illustrates an example memory array that supports recovery of fatigued ferroelectric memory cells in accordance with various embodiments of the present disclosure.

FIG. 1 illustrates an example memory array 100 that supports recovery of fatigued ferroelectric memory cells in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. Memory cell 105 may include a capacitor with a ferroelectric material. Ferroelectric materials have a spontaneous electric polarization—i.e., they have a non-zero polarization in the absence of an electric field. Some details and advantages of a ferroelectric memory cell 105 are discussed below. Different levels of charge of a ferroelectric capacitor may represent different logic states. As a ferroelectric memory cell 105 is cycled (e.g., cycled through read or write operations), its polarization may decrease due to fatigue, reducing the stored charge. Recovery operations may be applied to the memory cell 105 in order to restore its polarization.

Operations such as reading and writing (i.e., cycling) may be performed on memory cells 105 by activating or selecting the appropriate access line 110 and digit line 115. Access lines 110 may also be referred to as word lines 110 and digit lines 115 may also be referred to as bit lines 115. Activating or selecting a word line 110 or a digit line 115 may include applying a voltage to the respective line. Word lines 110 and digit lines 115 are made of conductive materials. For example, they may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection, which may be referred to as memory cell's address. Each access operation may reduce the remnant polarization of a memory cell 105 and, as the number of access operations increases with use, a memory cell 105 may become inoperable due to fatigue.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Other architectures may be used that do not include a transistor as a selection device. For example, a cross-point memory array architecture may be used.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In some cases, the recovery operation may be applied to a row, column, some combination of rows or columns, or the entire array. In other cases, memory array 100 may be a memory bank, and the recovery operation may be applied to the memory bank.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, the sense operation may determine that the memory cell 105 has reached a fatigue threshold. For example, sense component 125 may determine a reduction in stored charge of the memory cell 105 due to fatigue. A recovery operation may then be performed on the memory cell 105.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. The recovery voltages may, in some examples, be applied in a similar manner. That is, the recovery voltage may be applied across the ferroelectric capacitor by activating the relevant word line 110 and digit line 115. In some examples, the recovery voltage may be applied using a plate line, as discussed in more detail below.

In some memory architectures, such as DRAM, a single access operation of the memory cell 105 may degrade or destroy its stored logic state, and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures. By performing recovery operations to ferroelectric memory cells 105, their lifetime may be extended.

The memory controller 140 may control the operation (e.g., read, write, re-write, refresh, recovery, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltages used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state. Memory controller 140 may also distribute the recovery operations over multiple instances, which may help prevent the disruption of the host device's operation.

Figure 2:
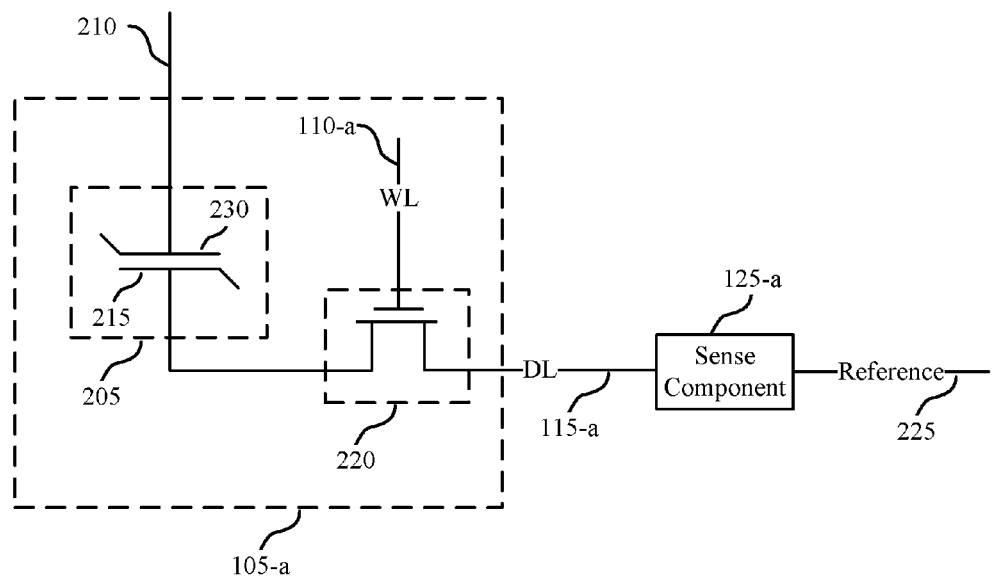
FIG. 2 illustrates an example circuit of a memory cell that supports recovery from fatigue in accordance with various embodiments of the present disclosure.

FIG. 2 illustrates an example circuit 200 that includes a memory cell 105 and supports recovery of fatigued ferroelectric memory cells in accordance with various embodiments of the present disclosure. Circuit 200 includes a ferroelectric memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference signal 225. In the example of FIG. 2, cell plate 230 may be accessed via plate line 210 and cell bottom 215 may be accessed via digit line 115-a. As described above, various states may be stored by charging or discharging capacitor 205. Recovery operations may be applied to memory cell 105-a, for example, by applying a voltage across the ferroelectric capacitor 205 using plate line 210 or digit line 115-a.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is equal to or greater than the magnitude of the threshold of the transistor. Word line 110-a may activate selection component 220; for example, a voltage applied to word line 110-a is applied to the transistor gate, connecting capacitor 205 with digit line 115-a. In an alternative embodiment, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. To sense the logic state stored by ferroelectric capacitor 205, word line 110-a may be biased to select memory cell 105-a and a voltage may be applied to plate line 210. This bias may be applied after activating selection component 220, or the bias may be constantly applied to cell plate 230. Biasing plate line 210 may result in a voltage difference across capacitor 205, which may yield a change in the stored charge on capacitor 205. The magnitude of the change in stored charge may depend on the initial state of capacitor 205—e.g., whether the initial state stored a logic 1 or a logic 0. This may induce a change in the voltage of digit line 115-a based on the charge stored on capacitor 205, which may be used to determine the stored logic state The change in the voltage of digit line 115-a may depend on its intrinsic capacitance—e.g., as digit line 115-a is energized, some finite charge may be stored in digit line 115-a and the resulting voltage of the digit line may depend on the intrinsic capacitance of digit line 115-a. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference signal 225 (e.g., a voltage of reference line) by sense component 125-a in order to determine the stored logic state in memory cell 105-a. As memory cell 105-a fatigues, the resulting voltage of digit line 115-a may change because less charge may be stored in memory cell 105-a. As such, the resulting digit line 115-a voltage may be used to determine if memory cell 105-a has reached its fatigue threshold.

Sense component 125-a may include various transistors or amplifiers to detect and amplify a difference in signals, which may be referred to as latching. Sense component 125-a may include a sense amplifier that receives and compares the voltage of digit line 115-a and reference signal 225, which may be a reference voltage. Sense component 125-a may then latch the output of the sense amplifier or the voltage of digit line 115-a, or both. The latched logic state of memory cell 105-a may then be output, for example, through column decoder 130 as output 135 with reference to FIG. 1.

To write memory cell 105-a, a voltage may be applied across capacitor 205. Various methods may be used. In some examples, selection component 220 may be activated through word line 110-a in order to electrically connect capacitor 205 to digit line 115-a. For a ferroelectric capacitor 205, a voltage may be applied across capacitor 205 by controlling the voltage of cell plate 230 (through plate line 210) and cell bottom 215 (through digit line 115-a) to apply a positive or negative voltage across the capacitor 205.

Recovery operations may also apply voltages across capacitor 205. For example, selection component 220 may be activated and a voltage may be applied across capacitor 205 using plate line 210 and digit line 115-a. In some examples, plate line 210 may be connected to multiple memory cells 105, and the recovery operation may be applied to each memory cell 105 connected to plate line 210. For example, plate line 210 may be commonly connected to a row of memory cells 105 and energizing word line 110-a may select all memory cells 105 in the corresponding row, as depicted in FIG. 1. Thus, multiple memory cells 105 may be recovered by energizing a single word line 110-a and plate line 210.

A recovery operation may use voltage amplitudes greater than those used during read or write operations. In some cases, internal circuitry may be used to create the larger recovery voltages. In other cases, plate line 210 may be in electronic communication with a voltage source used for recovery that is different from a voltage source used for memory cell access operations.

Figure 3:
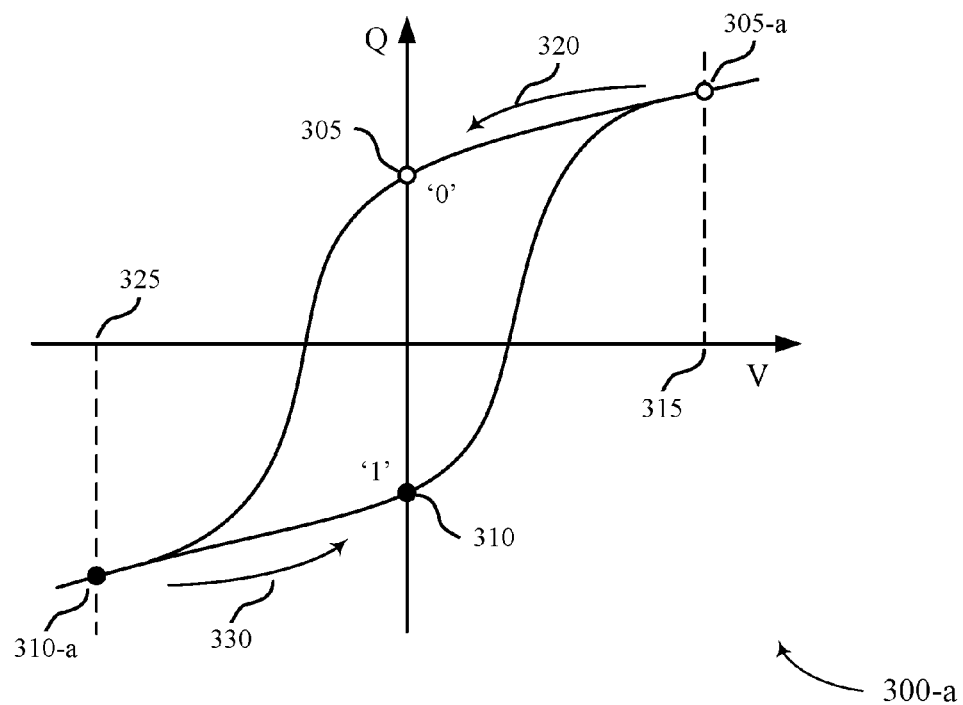
FIG. 3 illustrates example hysteresis plots for a pristine and a fatigued ferroelectric memory cells in accordance with various embodiments of the present disclosure.
Figure 3:
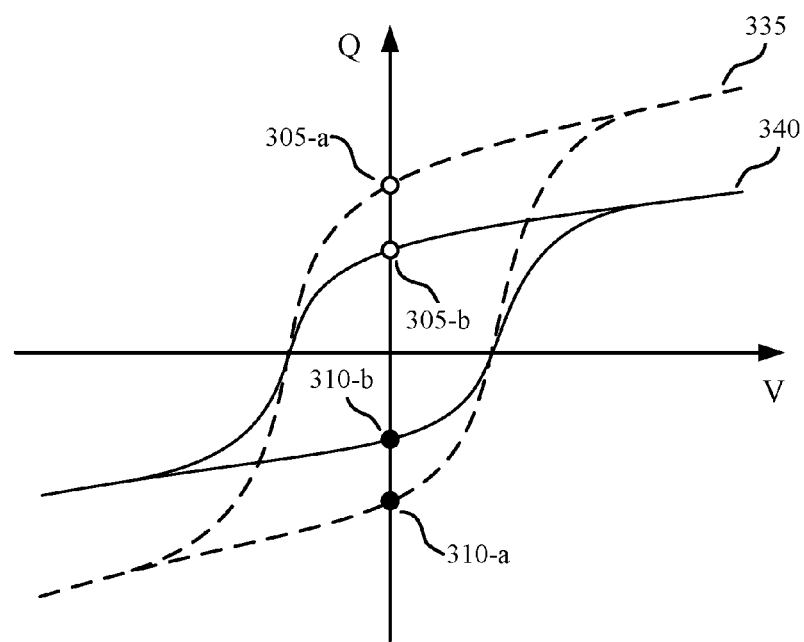

FIG. 3 illustrates example hysteresis plots for a ferroelectric memory cell that supports fatigue recovery of in accordance with various embodiments of the present disclosure. Hysteresis plots 300 depict the charge, Q, stored on a ferroelectric capacitor (e.g., capacitor 205 of FIG. 2) as a function of a voltage difference, V. The charge is proportional to the polarization of the ferroelectric material. Hysteresis plot 300-a shows example write operations of a ferroelectric memory cell 105, and hysteresis plot 300-b compares a pristine and fatigued ferroelectric memory cell 105.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis plots 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis plots 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis plots 300.

As depicted in hysteresis plot 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed without loss of understanding or operation.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, i.e., the polarization (or charge) that remains upon removing the external bias (e.g., voltage).

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. In some cases, the final stored charge may alter the voltage of the digit line in electronic communication with the memory cell 105. By comparing the digit line voltage to a reference voltage, the initial state of the capacitor may be determined.

In some cases, a read operation may be followed by a write-back operation, where the originally stored logic value is written to the memory cell 105. That is, the read operation may destroy the originally stored logic value of the target memory cell 105. The read process may use a positive voltage, for example, voltage 315 may be applied to the memory cell 105, although other voltages may be used. If a logic 1 was originally stored, the read voltage may result in charge state 310 following hysteresis plot 300-a until it reaches, for example, charge state 305-a, although other positions may be possible depending the exact sensing scheme. After the read voltage is removed, the charge state may not return to its original state, charge state 310, rather it may follow a different path, for example, path 320 and settle at charge state 305. In other words, a read operation of a logic 1 may result in writing a logic 0 to the memory cell. Thus, a write-back operation may be performed to return the originally stored logic value to the memory cell. For example, a negative voltage, such as voltage 325, may be applied to write-back the original logic 1 value.

As mentioned above, the remnant polarization may decrease with the number of cycles or access operations applied to a ferroelectric memory cell 105. Hysteresis plot 300-b compares a pristine and fatigued ferroelectric memory cell 105. Pristine hysteresis plot 335 (dashed line) shows the hysteresis plot for a pristine ferroelectric memory cell 105, whereas fatigued hysteresis plot 340 (solid line) shows a hysteresis plot for a fatigued memory cell 105. The fatigued hysteresis plot has a lower remnant polarization (indicated by charge states 305-*b* and 310-*b*) compared to the remnant polarization of pristine hysteresis plot 335 (indicated by charge states 305-*a* and 310-*a*).

Each access operation may further fatigue the memory cell; that is, both charge states 305-*b* and 310-*b* may continue to decrease in magnitude. This may affect the ability to sense or read the stored logic state in the memory cell 105. Reading a memory cell 105 may include differentiating between the two charge states, 305 and 310. As the ferroelectric capacitor continues to fatigue, the separation between charge states 305 and 310 continues to decrease. At some point, the memory array (e.g., a controller, sense amplifier, etc.) may not be able to properly distinguish between the two charge states—i.e., a minimum separation between charge states 305 and 310 may be needed to read the stored logic state. For example, the difference between charge states 305-*b* and 310-*b* may be insufficient for a sense component 125 to read the memory cell 105. In some cases, depending on the ferroelectric material, the fatigue limit may occur when the cycle counts exceeds approximately $10^8$ cycles, however, it may depend on the sensing scheme used by the memory array. For example, it may not occur until $10^{13}$ cycles.

A recovery operation may improve or restore the remnant polarization and thus increase the stored charge. For example, applying a recovery voltage to a fatigued memory cell 105 may restore fatigued hysteresis plot 340 to pristine hysteresis plot 335, thereby increasing the remnant polarization from charge states 305-*b* and 310-*b* to 305-*a* and 310-*a*, respectively. In some cases, the recovery operation may be applied before the fatigue threshold is reached, for example, at $10^{10}$ cycles. The recovery operation may include significantly fewer cycles, for example, $10^4$-$10^8$, although other values are possible.

Figure 4:
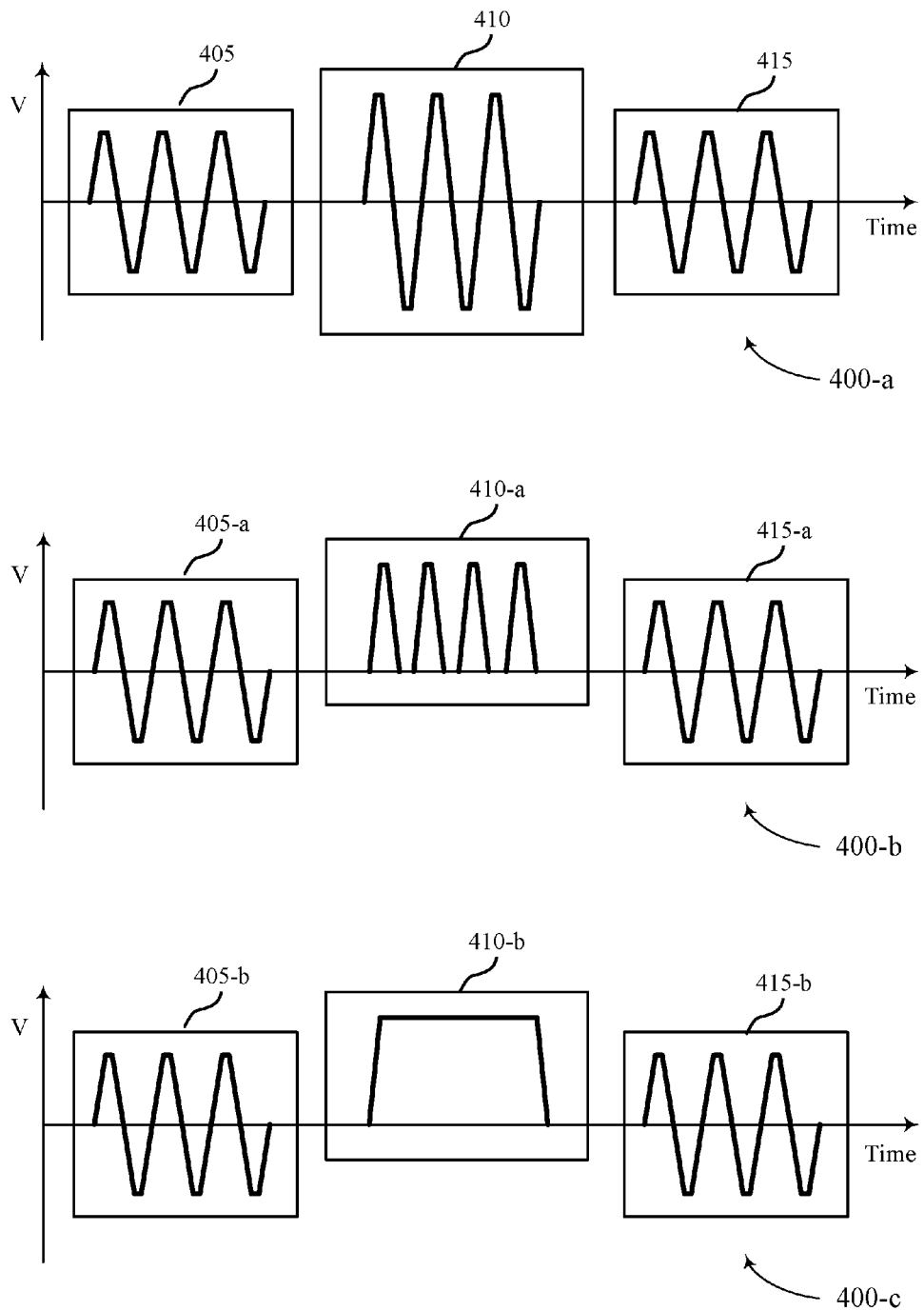
FIG. 4 illustrates example recovery operations that support recovery of fatigued ferroelectric memory cells in accordance with various embodiments of the present disclosure.

FIG. 4 illustrates example recovery operations, using plots 400-*a*, 400-*b*, and 400-*c*, that support recovery of fatigued ferroelectric memory cells in accordance with various embodiments of the present disclosure. Plots 400 illustrate example voltage cycling of a ferroelectric memory cell 105 with time. Plots 400 include access operations 405, recovery operation 410, and recovery measurement operation 415.

A memory cell 105 may be cycled—through reading or writing—during operation of the memory device. After some threshold (e.g., time, number of cycles, charge sensing, among others), recovery operation 410 may be performed to improve the remnant polarization of the memory cell 105, as discussed above with reference to FIG. 3. After the recovery operation, recovery measurement operation 415 may determine the effectiveness of the recovery operation 410. In some cases, recovery measurement operation 415 may not be performed; that is, normal cycling may begin after recovery operation 410. In other cases, recovery measurement operation 415 may be a single access operation of the memory cell 105.

Each operation—access operations 405, recovery operation 410, recovery measurement operation 415—may be applied to one or more memory cells 105. For example, the operations may represent the respective operations applied to a row, column, or various row/column combinations of memory cells 105. In some cases, the operations may be performed on an entire memory array 100. During access operations 405, a first voltage may be applied to a ferroelectric memory cell 105 during each cycle of a plurality of access cycles. For example, applying the first voltage may include reading or writing the ferroelectric memory cell 105.

After some number of access operations, it may be determined that the ferroelectric memory cell 105 reached a fatigue threshold based on applying the first voltage during access operations 405. The fatigue threshold may be based on a total number of access cycles in which the ferroelectric memory cell 105 reaches a remnant polarization threshold, as discussed above with reference to FIG. 3.

In some cases, determining that the memory cell 105 reached the fatigue threshold may include detecting one of a number of possible events. For example, detecting a timer exceeding a threshold time period, where the threshold time period may be based on a time to reach the fatigue threshold. In some cases, the time to reach the fatigue threshold may be based on a duration of each access cycle (e.g., a time period based on average operation of the memory device or a worst-case scenario of constant access operations).

In another example, determining that the memory cell 105 reached the fatigue threshold may include determining that a counter exceeded a threshold number of counts, where the counter is incremented for each access cycle of the plurality of access cycles. In some cases, the threshold number of counts is based on a number of access cycles to achieve the fatigue threshold of the ferroelectric memory cell 105. In some cases, this may be predetermined or programmed by a user.

In another example, determining that the memory cell 105 reached the fatigue threshold may include detecting a failure to sense the memory cell 105 based on applying a test access voltage with an amplitude less than an amplitude of the first voltage during access operations 405. For example, a lower access voltage may be applied to the ferroelectric memory cell 105 (e.g., using a plate line 210), which may result in a digit line 115 having a lower voltage, as discussed with reference to FIG. 3. Due to the lower digit line 115 voltage, the sense component 125 may be unable to read the memory cell 105, and recovery operations 410 may be initiated. That is, the fatigue threshold of the ferroelectric memory cell 105 may be based on a relationship between the charge stored in the ferroelectric memory cell 105 and a capacitance of the digit line 115 in electronic communication with the ferroelectric memory cell 105 and the sense component 125. By using a test voltage with a amplitude less than the typical access voltage, the memory cell 105 may be restored before it fails due to fatigue, preventing interruption of the memory device's operation.

In some examples, determining that the memory cell 105 reached the fatigue threshold may include detecting a failure to sense the ferroelectric memory cell 105 based on a test sense window that is less than a sense window used for each cycle of the plurality of access cycles. For example, the test sense window may be based on a reference voltage, and a different reference voltage may be used to modify the size of the test sense window.

In some examples, an error correction code that detects a corrupted logic value of the ferroelectric memory cell 105 may trigger the determination that memory cell 105 reached its fatigue threshold. For example, the sense component 125 may not be able to read the memory cell 105 and the unknown logic value may be corrected by the error correction code. Other events may be possible to determine if the memory cell 105 reached its fatigue threshold. For example, a command to initiate the fatigue recovery operation may be received. In some cases, the command may be generated external to the memory array, such as a system request.

After determining that ferroelectric memory cell 105 reached its fatigue threshold, a second voltage may be applied to the ferroelectric memory cell 105—for example, during recovery operations 410. In some cases, an amplitude of the second voltage may be greater than an amplitude of the first voltage. The second voltage may be applied for a time period or a number of repetitions that is based on the fatigue threshold of the ferroelectric memory cell. In some examples, the time period or the number of repetitions of the second voltage is based on the amplitude of the second voltage. In some cases, a counter may be incremented each time the second voltage is applied during recovery operations 410.

In some examples, the second voltage may be applied during a refresh operation that restores a logic state to the ferroelectric memory cell 105, where the logic state is determined based on applying the first voltage. For example, a read operation during an access operation 405 may be followed by a write-back or refresh operation. The second voltage—the recovery operation 410—may be applied during the write-back operation. In some examples, several cycles at the higher voltage or a constant voltage stress may be applied during the refresh operation.

In some cases, the memory array 100 comprises an element of a device, for example, a mobile device or any other electronic device. The second voltage used during recovery operations 410 may be applied to the ferroelectric memory cell 105 during an event that includes at least one of the device powering on, the device powering off, or the device being connected to an external power supply. Or, memory array 100 may receive a command, for example from another element of the device, to initiate the recovery operation and apply the second voltage. This may reduce the effect of recovery operations 410 on the operation of the host device or its power source (e.g., its battery). In some cases, recovery operations 410 may be a burst of recovery cycles performed at a fixed rate—for example, when the host device is charging and connected to an external power source.

In some examples, recovery operation 410 may be applied to the entire memory array. In other cases, recovery operation 410 may be applied to a subset of the memory array. For example, part of the memory array may be recovered while the remainder of the array operates normally, such that the recovery operation 410 can occur in the background without affecting the host device's operation.

After performing recovery operations 410, recovery measurement operation 415 may be performed. For example, recovery measurement operation 415 may determine if the recovery operations 410 restored the memory cell 105 from fatigue effects. In some cases, this may include a test access operation, e.g., a read operation. Recovery measurement operation 415 may determine that a charge stored in the ferroelectric memory cell 105 after applying the second voltage (i.e., during recovery operations 410) is greater than a charge stored in the memory cell 105 before applying the second voltage. In some cases, the determination may be based on a sense voltage produced by the memory cell 105, as described with reference to FIG. 3.

Plots 400-a, 400-b, and 400-c illustrate different recovery operations 410. Plot 400-a illustrates a recovery operation 410 where the second voltage is a plurality of bipolar voltage pulses. In other cases, the second voltage may be a plurality of unipolar pulses, as shown in recovery operation 410-a of plot 400-b. In other examples, such as recovery operation 410-b of plot 400-c, the second voltage may be a voltage with a constant amplitude. Although shown with positive amplitudes in plots 400-b and 400-c, recovery operations 410-a and 410-b may use negative amplitudes. The number of recovery pulses may vary, for example, $10^4$ to $10^8$ cycles may be used, although other values may be possible. The time period of recovery operation 400-b may be equal to the total time period in which the voltage pulses of recovery operations 410 and 410-a are applied.

The effect of recovery operation 410 may depend on the amplitude of the second voltage and the number of pulses or the total time length of the constant voltage. That is, a pulse with a larger amplitude may achieve recovery with fewer pulses or a shorter time period. For example, a memory cell 105 fatigued by 1.5V access operations may be recovered by $10^7$ pulses using a 1.8V recovery voltage amplitude. In another example, a memory cell 105 fatigued by 1.5V access operations may be recovered by $10^4$ pulses using a 2.4V amplitude. Other access and recovery amplitudes are possible, as well as the number of pulses.

In some examples, recovery operation 410 may be more effective with a higher number of recovery cycles. In other examples, slower recovery pulses may improve the recovery effect compared to faster pulses. The recovery effectiveness may be a function of the total duration of the recovery cycles (recovery operations 410 and 410-a) or the constant amplitude (recovery operation 410-b).

In some examples, recovery operations 410 may be changed during the operation of the memory device. For example, the amplitude of recovery operations 410 may change over the memory cell's 105 lifetime. For example, later recovery operations 410 may use a greater amplitude to recover a memory cell 105. In some cases, the number of pulses or the time period of the second voltage may change as well, for example, more recovery pulses may be used later in the memory cell's lifetime.

Figure 5:
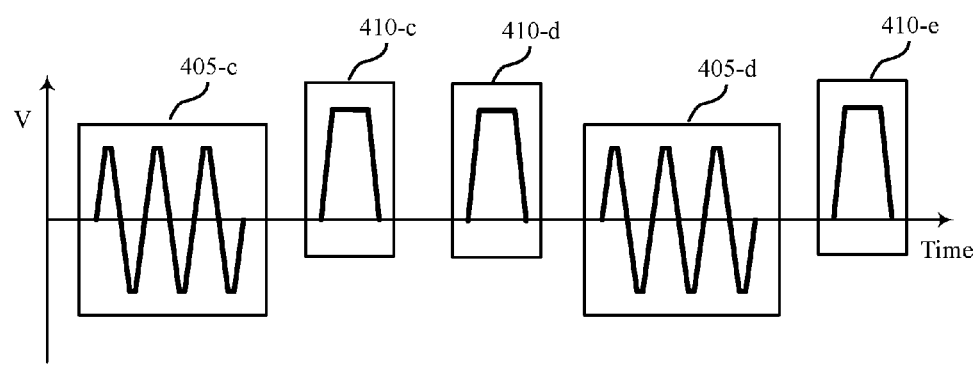
FIG. 5 illustrates example distributed operations that support recovery of fatigued ferroelectric memory cells in accordance with various embodiments of the present disclosure.

FIG. 5 illustrates an example distributed recovery operation, using plot 500, that supports recovery of fatigued ferroelectric memory cells in accordance with various embodiments of the present disclosure. Plot 500 illustrates example voltage cycling of a ferroelectric memory cell 105 with time, which may be an example of a plot 400 with reference to FIG. 4. Plot 500 include access operations 405-c and 405-d and recovery operations 410-c, 410-d, and 410-e, which may be examples of access operations 405 and recovery operations 410, as discussed with reference to FIG. 4. Recovery operations 410-c, 410-d, and 410-e may use any combination of unipolar pulses, bipolar pulses, or constant amplitude voltages, as discussed with reference to FIG. 4. As illustrated, recovery operations 410 may be distributed during the operation of the memory cell 105. For example, recovery operations 410 may be interrupted, for example, due to the host device using the memory array, and the recovery operations 410 may be paused. Recovery operations may also be applied or performed periodically. Each access or recovery operation may be applied to a row, column, or various row/column combinations of memory cells 105, including an entire memory array 100. In some cases, a recovery measurement operation 415 may be applied following a recovery operation 410, as discussed with reference to FIG. 4.

During access operations 405-c, a first voltage may be applied to a ferroelectric memory cell 105 during each cycle of a plurality of access cycles. For example, applying the first voltage to access the ferroelectric memory cell 105 may include reading or writing the ferroelectric memory cell 105.

After some number of access operations, the ferroelectric memory cell 105 may be determined to have reached a fatigue threshold based on applying the first voltage during access operations 405-*c*. In some cases, determining that the ferroelectric memory cell 105 has reached the fatigue threshold may include detecting one of a number of possible events as described with reference to FIG. 4.

After determining that ferroelectric memory cell 105 reached its fatigue threshold, a second voltage may be applied to the ferroelectric memory cell 105 during recovery operations 410-*c*. In some cases, an amplitude of the second voltage may be greater than an amplitude of the first voltage. The second voltage may be applied for a time period or a number of repetitions that is based on the fatigue threshold of the ferroelectric memory cell. In some examples, the time period or the number of repetitions of the second voltage is based on the amplitude of the second voltage.

In some cases, the recovery operation 410 may be distributed among multiple recovery operations, such as recovery operations 410-*c*, 410-*d*, and 410-*e*. That is, the second voltage may be applied for the time period or the number of repetitions during a plurality of instances of an event, where a subset of the time period or a subset of the number of repetitions is associated with each instance of the event. For example, recovery operations 410-*c*, 410-*d*, and 410-*e* may represent the plurality of instances of the event. In some examples, the memory array comprises an element of a device, and the event may include at least one of the device powering on, the device powering off, or the device being connected to an external power supply. Or the recovery operation 410 may be performed after receiving a command to perform the recovery operation, for example, receiving an external command.

The memory device may operate normally between each recovery operation 410. For example, access operations 405-*d* may represent the operation of the memory device during the time period after the device powered on but is not currently powering down. Or, access operations 405-*d* may represent operation when the device is not connected to an external power supply.

In some cases, access operations 405-*d* may represent a command being received by the memory array to access the array's contents. For example, the application of the second voltage may be suspended based on receiving the request to access the memory array. After the access operation has completed, recovery operations may resume as shown with recovery operations 410-*e*. That is, application of the second voltage may be resumed based on completing the request.

During recovery operations 410-*c*, 410-*d*, and 410-*e*, a counter may be incremented each time the second voltage is applied. For example, the total recovery operation may include some predetermined number of pulses, and the counter may keep track of the total number of applied pulses throughout the distributed recovery operation 410.

Figure 6:
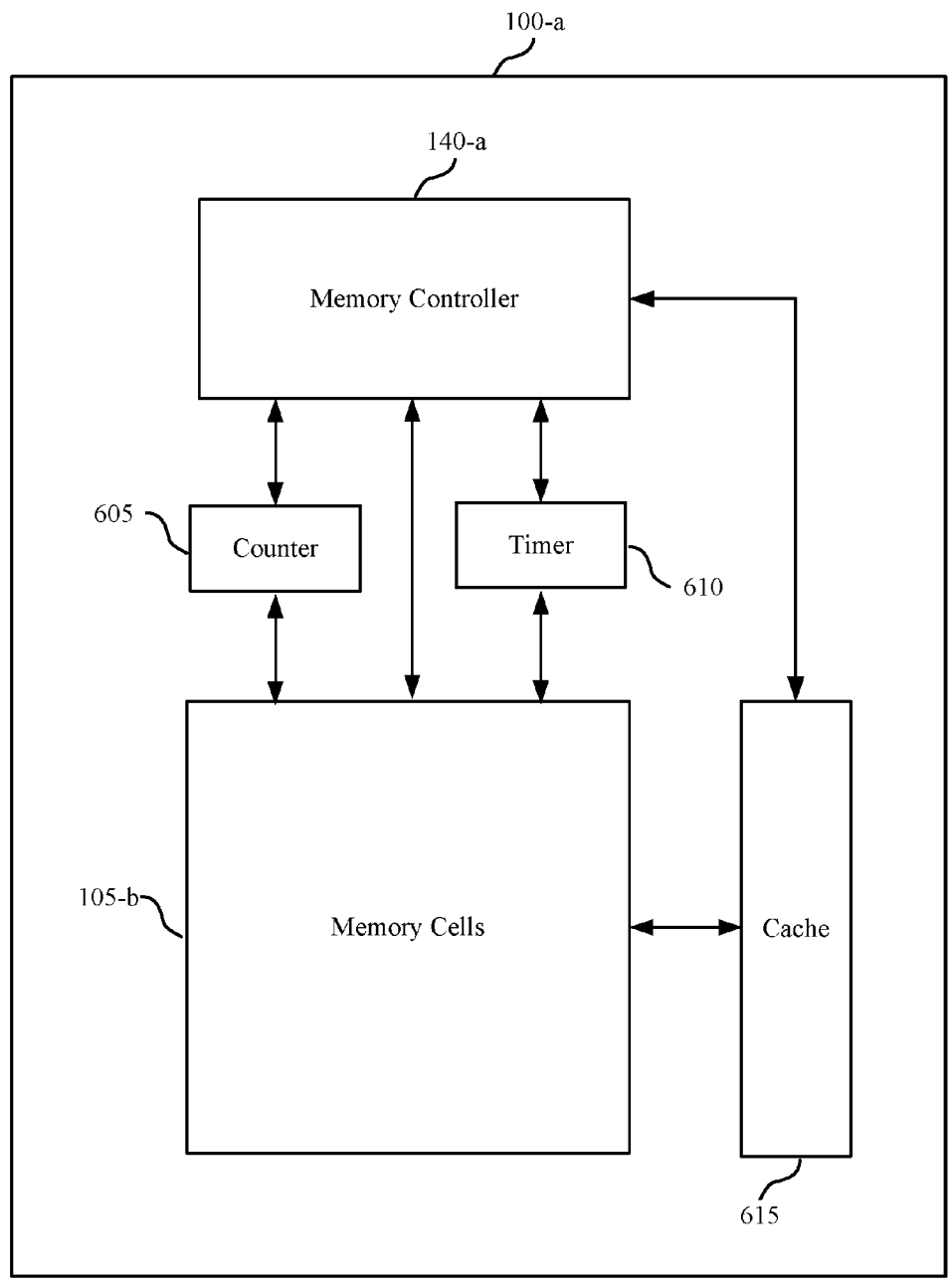
FIG. 6 illustrates a block diagram of an example ferroelectric memory array that supports recovery of fatigued ferroelectric memory cells in accordance with various embodiments of the present disclosure.

FIG. 6 illustrates a block diagram 600 of a memory array that supports recovery of fatigued ferroelectric memory cells in accordance with various embodiments of the present disclosure. Memory array 100-*a* may be referred to as an electronic memory apparatus and includes memory controller 140-*a* and memory cell 105-*b*, which may be examples of memory controller 140 and memory cell 105 described with reference to FIGS. 1 and 2. Memory cells 105-*b* may be ferroelectric memory cells. Memory array 100-*a* includes counter 605, timer 610, and cache 615. Cache 615 may include memory cells 105, which may be memory cells of any type, for example, non-volatile or volatile, such as DRAM cells.

Memory array 100-*a* may include multiple ferroelectric memory cells 105-*b*. Counter 605 may be resettable based on a fatigue recovery operation performed on at least one ferroelectric memory cell 105 of the plurality of ferroelectric memory cells 105-*b*. In other cases, timer 610 may be reset instead of counter 605. In some cases, memory array 100-*a* may include a plurality of memory blocks that comprise a subset of the memory array, where each memory block may be associated with at least one counter 605 or timer 610.

Memory controller 140-*a* may be configured to perform the fatigue recovery operation. The fatigue recovery operation may include a determination that the at least one ferroelectric memory cell 105-*b* has reached a fatigue threshold based on applying a first voltage to the at least one ferroelectric memory cell 105-*b* for a plurality of access cycles. In some examples, memory controller 140 may receive a command instructing it to perform the recovery operation. The fatigue recovery operation may also include applying a second voltage to the at least one ferroelectric memory cell 105-*b* based on the determination that the ferroelectric memory cell 105-*b* has reached the fatigue threshold, where an amplitude of the second voltage is greater than an amplitude of the first voltage. The second voltage may be applied for a time period or a number of repetitions that is based on the fatigue threshold of the ferroelectric memory cell 105-*b*. In some cases, memory controller 140-*a* may increment or reset counter 605, or it may start or reset timer 610.

In some cases, some memory cells 105 may be accessed while other memory cells 105 are being recovered. For example, memory controller 140-*a* may also perform the fatigue recovery operation on a first ferroelectric memory cell 105 of the plurality of ferroelectric memory cells 105-*b* and perform an access operation on a second ferroelectric memory cell 105 of the plurality during the fatigue recovery operation of the first ferroelectric memory cell 105.

In some examples, after determining that the at least one memory cell 105-*b* has reached its fatigue threshold, the logic state of the ferroelectric memory cell 105-*b* may be stored in another memory cell 105, for example, in cache 615, because the recovery operation may be destructive. After caching, the second voltage may be applied to the ferroelectric memory cell 105-*b*. After the recovery operation, a logic state of the other memory cell 105 (in cache 615) may be determined and it may be written to the recovered ferroelectric memory cell 105-*b*. Such an operation may be performed for multiple memory cells 105.

In some examples, the recovery operation may be applied to multiple memory cells 105. For example, memory cells 105-*b* may include multiple rows, where each row includes a plate line 210 in electronic communication with multiple ferroelectric memory cells 105. The second voltage may be applied to at least one plate line 210, where the second voltage is applied to each ferroelectric memory cell 105 that is in electronic communication with the plate line 210. In some cases, the second voltage may be applied to multiple plate lines 210.

Figure 7:
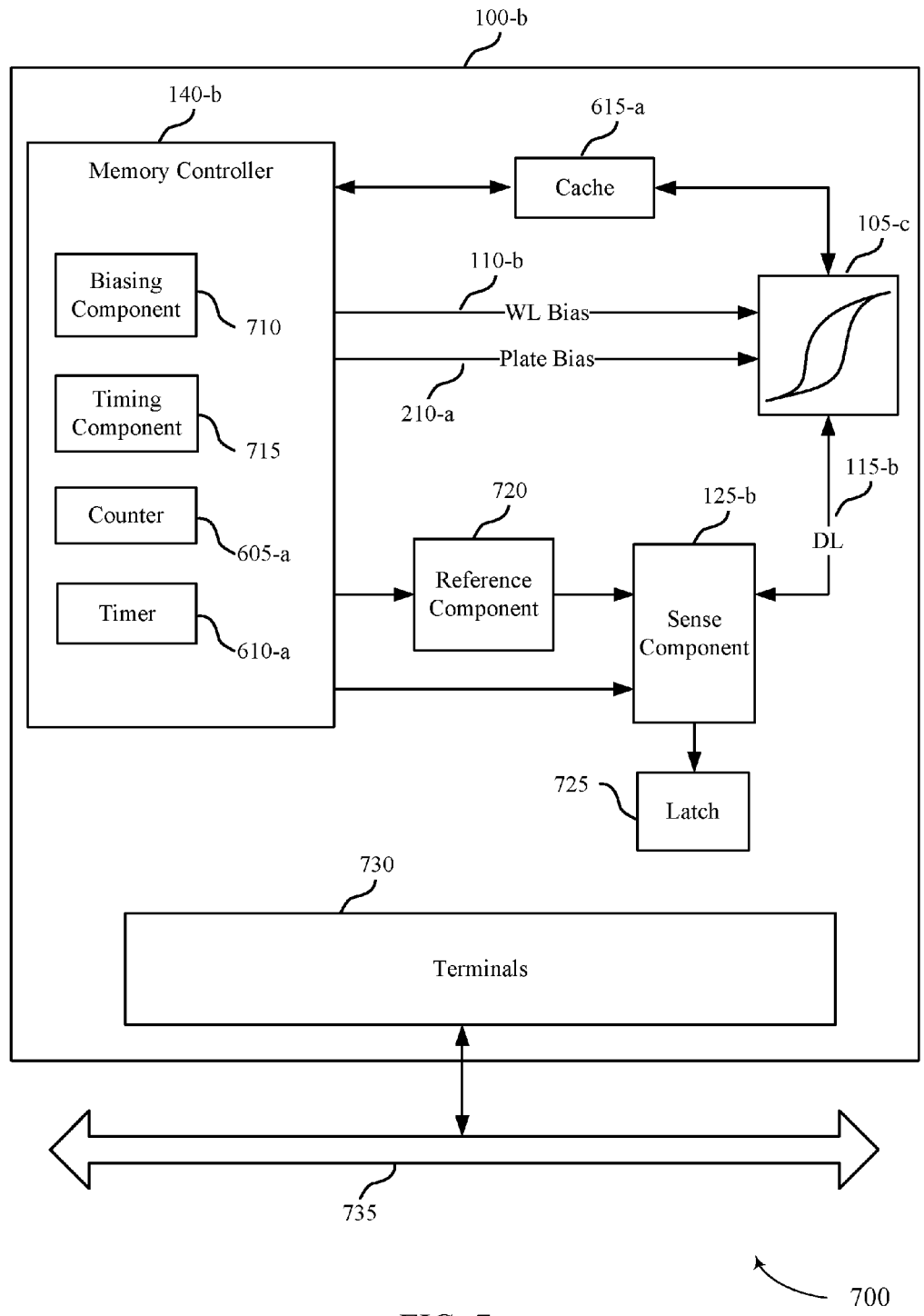
FIG. 7 illustrates a block diagram of an example ferroelectric memory array that supports recovery of fatigued ferroelectric memory cells in accordance with various embodiments of the present disclosure.

FIG. 7 shows a block diagram 700 of a memory array 100-*b* that supports recovery of fatigued ferroelectric memory cells in accordance with various embodiments of the present disclosure. Memory array 100-*b* may be referred to as an electronic memory apparatus or an electronic circuit and may include memory controller 140-*b* and memory cell 105-*c*, which may be examples of memory controller 140 and memory cell 105 described with reference to FIGS. 1, 2, and 6. Memory controller 140-*b* may include counter 605-*a* and timer 610-*a*, which may be examples of a counter 605 and timer 610 with reference to FIG. 6. Memory controller 140-*b* also includes biasing component 710 and timing component 715 and may operate memory array 100-*b* as described in FIGS. 1-6. Memory controller 140-*b* may be in electronic communication with word line 110-*b*, digit line 115-*b*, sense component 125-*b*, and plate line 210-*a*, which may be examples of word line 110, digit line 115, sense component 125, and plate line 210 described with reference to FIG. 1 or 2. Memory array 100-*b* may also include reference component 720, latch 725, and terminals 730, where terminals 730 may be in electronic communication with bus 735. The components of memory array 100-*b* may be in electronic communication with each other and may perform the functions described with reference to FIGS. 1-6. In some cases, reference component 720, sense component 125-*b*, and latch 725 may be components of memory controller 140-*b*.

Memory controller 140-*b* may be configured to activate word line 110-*b*, plate line 210-*a*, or digit line 115-*b* by applying voltages to those various nodes. For example, biasing component 710 may be configured to apply a voltage to operate memory cell 105-*c* to read, write, or perform recovery operations as described above. In some cases, memory controller 140-*b* may include a row decoder, column decoder, or both, as described with reference to FIG. 1. This may enable memory controller 140-*b* to access one or more memory cells 105. Biasing component 710 may also provide a voltage source for reference component 720 in order to generate a reference signal for sense component 125-*b*. Additionally, biasing component 710 may provide voltages for the operation of sense component 125-*b*.

Memory array 100-*b* may include multiple ferroelectric memory cells 105-*c*. Memory array 100-*b* may also include a plurality of conductive terminals 730 that are in electronic communication with the memory array. In some examples, terminals 730 may include a recovery terminal that supports a fatigue recovery operation of the ferroelectric memory cells 105-*c*. In some examples, the fatigue recovery operation may include a recovery voltage applied to at least one ferroelectric memory cell 105-*c* based on a determination that ferroelectric memory cell 105-*c* has reached a fatigue threshold. In some examples, an amplitude of the recovery voltage may be greater than an amplitude of an access voltage, and the recovery voltage may be applied for a time period or a number of repetitions that is based on the fatigue threshold.

In some cases, terminals 730 may include a first power terminal in electronic communication with a first voltage supply. The first voltage may be used for applying the access voltage and may be applicable to ferroelectric memory cell 105-*c* of memory array 100-*b* during an access operation of ferroelectric memory cell 105-*c*. Terminals 730 may also include a second power terminal in electronic communication with a second voltage supply. The second voltage may be used for applying the recovery voltage and may be applicable to ferroelectric memory cell 105-*c* during the fatigue recovery operation of ferroelectric memory cell 105-*c*.

In some examples, the fatigue recovery operation may include receiving a command to initiate the fatigue recovery operation of the ferroelectric memory cells 105-*c* via the recovery terminal. For example, another element of the device may direct the memory array to perform the fatigue recovery operation. In some cases, the command may indicate which memory cells should be recovered (e.g., the command may contain the addresses of the memory cells to be recovered). In some cases, the command to initiate the fatigue recovery operation may be received from a controller. The command may be received at certain intervals or it may be triggered by a particular event, such as refresh operation or the like.

In some cases, the fatigue recovery operation may include parameters that are programmable by a user or third party, such as a device manufacturer that manufactures a device that includes the memory array. Such programmable parameters may include the time period or the number of repetitions of the second voltage, or the amplitude of the second voltage. Other programmable parameters may include the threshold time period in which the fatigue threshold is reached, the threshold number of access cycles in which the fatigue threshold is reached, or the test window size. In some cases, programmable parameters may include determining which events the fatigue recovery operation may be applied, such as when the device powers on, powers off, or is connected to an external power supply.

In some cases, memory controller 140-*b* may perform its operations using timing component 715. For example, timing component 715 may control the timing of the various word line selections or plate biasing, including timing for switching and voltage application to perform the memory functions, such as reading, writing, and recovery, discussed herein. In some cases, timing component 715 may control the operations of biasing component 710.

Reference component 720 may include various components to generate a reference signal for sense component 125-*b*. Reference component 720 may include circuitry configured to produce a reference signal. In some cases, reference component 720 may be other ferroelectric memory cells 105. In some examples, reference component 720 may be configured to output a voltage with a value between the two sense voltages, as described with reference to FIG. 3. Or reference component 720 may be designed to output a virtual ground voltage (i.e., approximately 0V).

Sense component 125-*b* may compare a signal from memory cell 105-*e* (through digit line 115-*b*) with a reference signal from reference component 720. Upon determining the logic state, the sense component may then store the output in latch 725, where it may be used in accordance with the operations of an electronic device that memory array 100-*b* is a part. In other cases, sense component 125-*b* may determine that memory cell 105-*c* has reached a fatigue threshold, where the fatigue threshold of ferroelectric memory cell 105-*c* may be based on a relationship between the charge stored in the ferroelectric memory cell 105-*c* and a capacitance of digit line 115-*b* in electronic communication with the ferroelectric memory cell 105-*c* and sense component 125-*b*.

Figure 8:
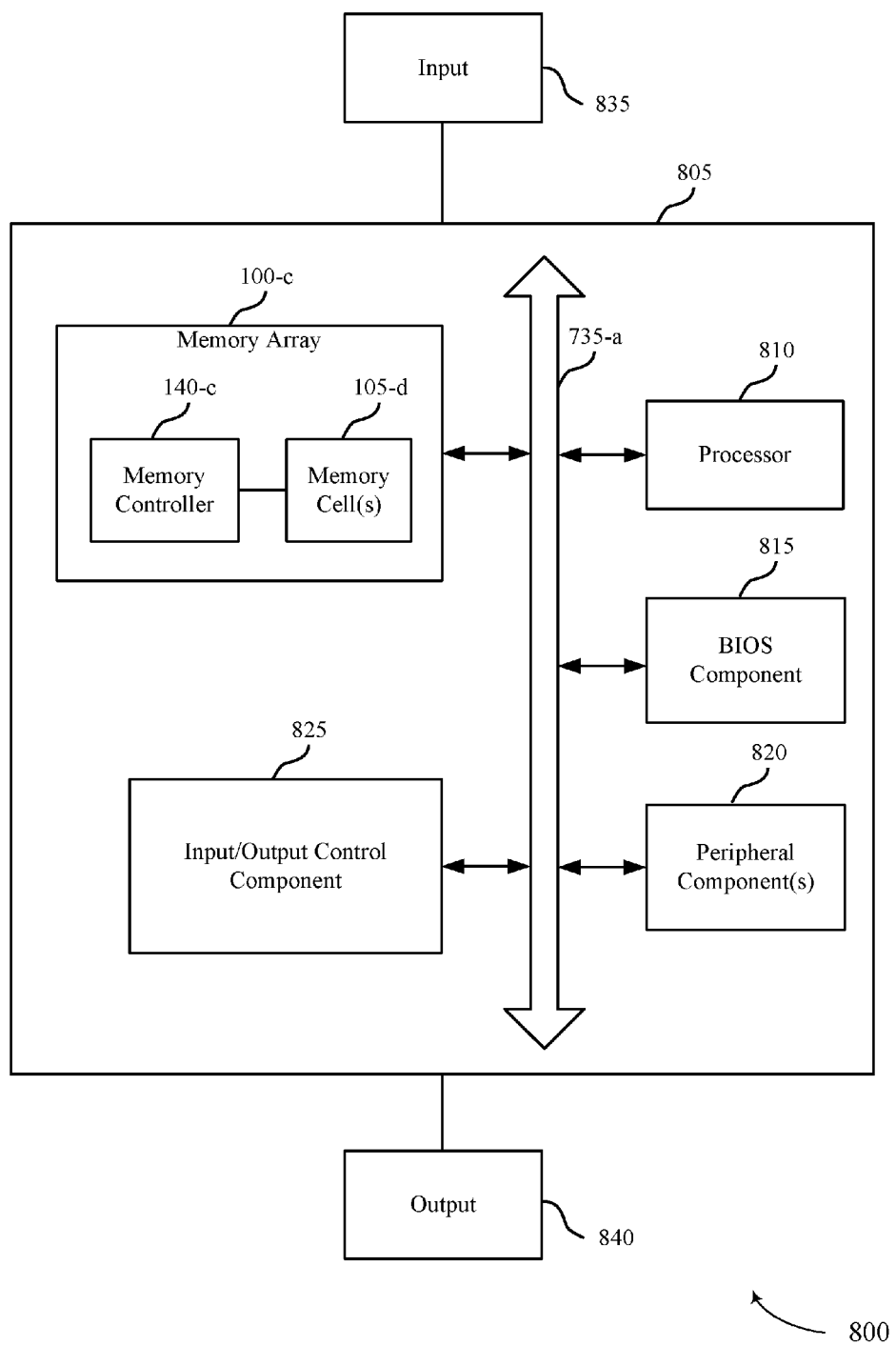
FIG. 8 illustrates a system, including a memory array, that supports recovery of fatigued ferroelectric memory cells in accordance with various embodiments of the present disclosure.

FIG. 8 illustrates a system 800 that supports recovery of fatigued ferroelectric memory cells in accordance with various embodiments of the present disclosure. System 800 includes a device 805, which may be or include a printed circuit board to connect or physically support various components. Device 805 includes a memory array 100-*d*, which may be an example of memory array 100 described with reference to FIGS. 1, 6, and 7. Memory array 100-*c* may contain memory controller 140-*c* and memory cell(s) 105-*d*, which may be examples of memory controller 140 described with reference to FIGS. 1, 6, and 7, and memory cells 105 described with reference to FIGS. 1, 2, 6, and 7. Device 805 includes bus 735-*a*, which may be an example of a bus 735 with reference to FIG. 7. Device 805 may also include a processor 810, BIOS component 815, peripheral component(s) 820, and input/output control component 825. The components of device 805 may be in electronic communication with one another through bus 735-*a*.

Processor 810 may be configured to operate memory array 100-*a* through memory controller 140-*c*. In some cases, processor 810 may perform the functions of memory controller 140 described with reference to FIGS. 1 and 7. In other cases, memory controller 140-*c* may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 810 may perform various functions described herein, including recovery of cycling wear-out in ferroelectric memories. Processor 810 may, for example, be configured to execute computer-readable instructions stored in memory array 100-*c* to cause device 805 perform various functions or tasks. In some cases, processor 810 may send a command to memory array 100-*c* in order to access its stored contents. Memory array 100-*c* may suspend a recovery operation based on the command and may resume the recovery operation after performing the commanded operation.

BIOS component 815 may be a software component that includes a basic input/output system (BIOS) operated as firmware, which may initialize and run various hardware components of system 800. BIOS component 815 may also manage data flow between processor 810 and the various components, e.g., peripheral components 820, input/output control component 825, etc. BIOS component 815 may include a program or software stored in read-only memory (ROM), flash memory, or any other non-volatile memory.

Peripheral component(s) 820 may be any input or output device, or an interface for such devices, that is integrated into device 805. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 825 may manage data communication between processor 810 and peripheral component(s) 820, input devices 835, or output devices 840. Input/output control component 825 may also manage peripherals not integrated into device 805. In some cases, input/output control component 825 may represent a physical connection or port to the external peripheral.

Input 835 may represent a device or signal external to device 805 that provides input to device 805 or its components. This may include a user interface or interface with or between other devices. In some cases, input 835 may be a peripheral that interfaces with device 805 via peripheral component(s) 820 or may be managed by input/output control component 825. In some examples, input 835 may enable the user to program the recovery operations.

Output 840 may represent a device or signal external to device 805 configured to receive output from device 805 or any of its components. Examples of output 840 may include a display, audio speakers, a printing device, another processor or printed circuit board, etc. In some cases, output 840 may be a peripheral that interfaces with device 805 via peripheral component(s) 820 or may be managed by input/output control component 825.

The components of memory controller 140-*c*, device 805, and memory array 100-*c* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 9:
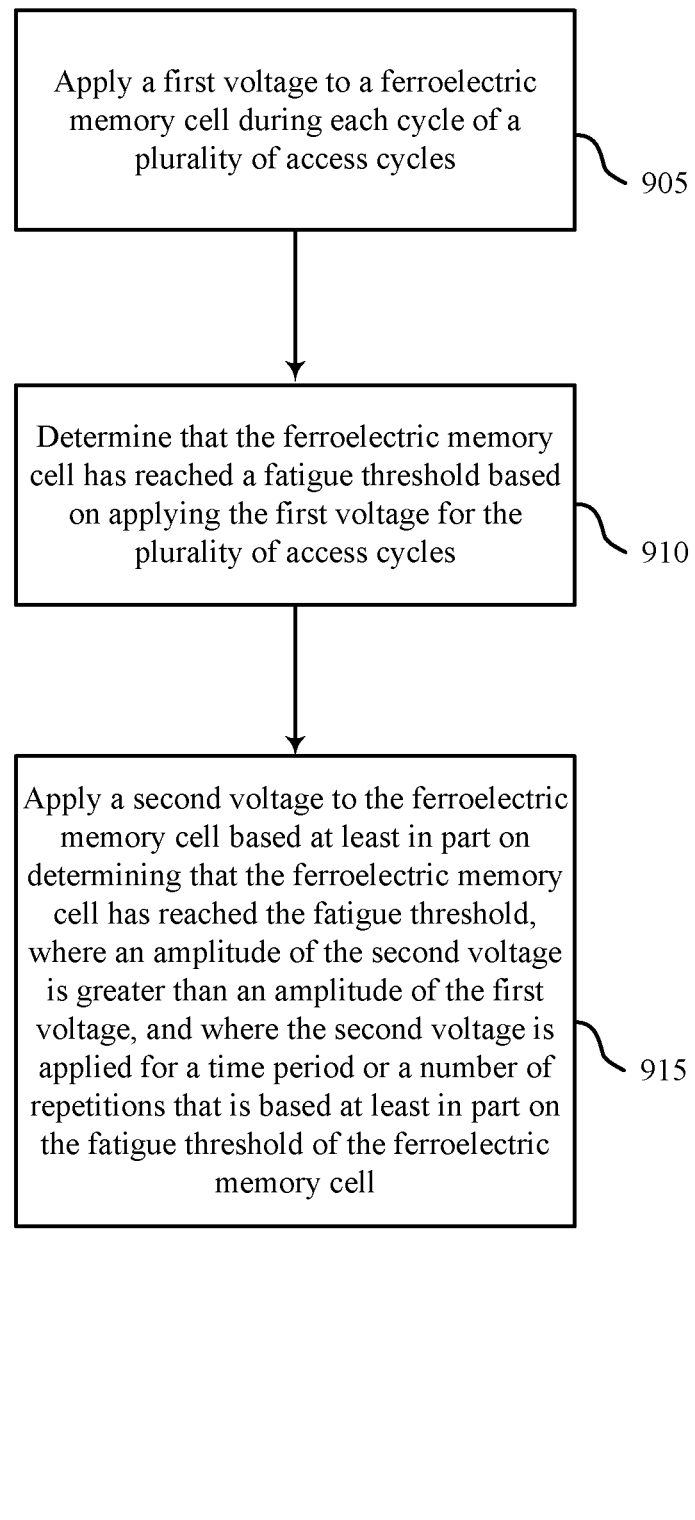
FIG. 9 is a flowchart that illustrates a method or methods for recovery of fatigued ferroelectric memory cells in accordance with various embodiments of the present disclosure.

FIG. 9 shows a flowchart illustrating a method 900 for recovery of fatigued ferroelectric memory cells in accordance with various embodiments of the present disclosure. The operations of method 900 may be implemented by a memory array 100, as described with reference to FIGS. 1-7. For example, the operations of method 900 may be performed by a memory controller 140 as described with reference to FIGS. 1, 6, 7, and 8. In some examples, a memory controller 140 may execute a set of codes to control the functional elements of the memory array 100 to perform the functions described below. Additionally or alternatively, the memory controller 140 may perform the functions described below using special-purpose hardware.

At block 905, the method may include applying a first voltage to a ferroelectric memory cell during each cycle of a plurality of access cycles, as described with reference to FIGS. 1-8. In some cases, applying the first voltage to access the ferroelectric memory cell includes reading or writing the ferroelectric memory cell. In certain examples, the operations of block 905 may be performed or facilitated by the memory controller 140, as described with reference to FIGS. 1, 6, 7, and 8.

At block 910, the method may include determining that the ferroelectric memory cell has reached a fatigue threshold based on applying the first voltage for the plurality of access cycles, as described with reference to FIGS. 1-8. In some examples, determining that the ferroelectric memory cell has reached the fatigue threshold includes detecting at least one of a timer exceeding a threshold time period, where the threshold time period is based at least in part on a time to reach the fatigue threshold; a counter exceeding a threshold number of counts, where the counter is incremented for each access cycle of the plurality of access cycles; a failure to sense the ferroelectric memory cell based on applying a test access voltage with an amplitude less than an amplitude of the first voltage; a failure to sense the ferroelectric memory cell based on a test sense window that is less than a sense window used for each cycle of the plurality of access cycles, where the test sense window is based at least in part on a reference voltage; or an error correction code detecting a corrupted logic value of the ferroelectric memory cell. In some examples, determining that the ferroelectric memory cell has reached the fatigue threshold includes receiving a command to perform a fatigue recovery operation. In certain examples, the operations of block 910 may be performed or facilitated by the memory controller 140, as described with reference to FIGS. 1, 6, 7, and 8, or the counter 605 or timer 610, as described with reference to FIGS. 6 and 7.

At block 915, the method may include applying a second voltage to the ferroelectric memory cell based at least in part on determining that the ferroelectric memory cell has reached the fatigue threshold, where an amplitude of the second voltage is greater than an amplitude of the first voltage, and where the second voltage is applied for a time period or a number of repetitions that is based at least in part on the fatigue threshold of the ferroelectric memory cell, as described with reference to FIGS. 1-8.

In some examples, the second voltage includes at least one of a plurality of bipolar voltage pulses, a plurality of unipolar voltage pulses, or a voltage with a constant amplitude. The time period or the number of repetitions of the second voltage may be based on the amplitude of the second voltage. In some examples, the method may include incrementing a counter each time the second voltage is applied or starting a timer while a voltage with a constant amplitude is applied.

In some cases, applying the second voltage for the time period or the number of repetitions includes applying the second voltage during multiple instances of an event, where a subset of the time period or a subset of the number of repetitions is associated with each instance of the event. In some examples, the method may include suspending the application of the second voltage based on receiving a request to access the memory array and resuming the application of the second voltage based on completing the request.

In some examples of the method, the memory array may be an element of a device, and applying the second voltage to the ferroelectric memory cell may include applying the second voltage to the ferroelectric memory cell during an event that includes least one of: the device powering on, the device powering off, or the device being connected to an external power supply. In certain examples, the operations of block 915 may be performed or facilitated by the memory controller 140, as described with reference to FIGS. 1, 6, 7, and 8.

In some examples, the method may include determining a logic state of the ferroelectric memory cell based on determining that the ferroelectric memory cell has reached the fatigue threshold and storing the logic state of the ferroelectric memory cell in another memory cell, where the second voltage is applied to the ferroelectric memory cell after storing the logic state of the ferroelectric memory cell in the other memory cell. The method may include determining a logic state of the other memory cell after applying the second voltage and writing the logic state of the other memory cell to the ferroelectric memory cell.

The method may include applying the second voltage during a refresh operation that restores a logic state to the ferroelectric memory cell, where the logic state is determined based at least in part on applying the first voltage.

In some examples, the memory array comprises a plurality of rows, where each row of the plurality of rows comprises a plate line in electronic communication with a plurality of ferroelectric memory cells. Applying the second voltage may include applying the second voltage to at least one plate line, where the second voltage is applied to each ferroelectric memory cell that is in electronic communication with the plate line. In some examples, applying the second voltage to the plate line includes applying the second voltage to a plurality of plate lines.

In some examples of the method, the fatigue threshold of the ferroelectric memory cell may be based on a relationship between the charge stored in the ferroelectric memory cell and a capacitance of a digit line in electronic communication with the ferroelectric memory cell and a sense component. In other examples, the fatigue threshold of the ferroelectric memory cell may be based on a total number of access cycles in which the ferroelectric memory cell reaches a remnant polarization threshold.

The method may also include determining that a charge stored in the ferroelectric memory cell after applying the second voltage is greater than a charge stored in the ferroelectric memory cell before applying the second voltage, where the determination is based on a sense voltage produced by the ferroelectric memory cell.

Thus, method 900 may be a method for operating a memory array to provide for recovery of fatigued ferroelectric memory cells. It should be noted that method 900 describes possible implementations, and the operations and steps may be rearranged or otherwise modified such that other implementations are possible.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The terms "amplitude" and "magnitude" as used in relation to physical values, signals, or quantities, may be synonymous.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:
1. A method, comprising:
applying a first voltage to a ferroelectric memory cell of a memory array during each cycle of a plurality of access cycles;

determining that the ferroelectric memory cell has reached a fatigue threshold based at least in part on applying the first voltage for the plurality of access cycles; and applying a second voltage to the ferroelectric memory cell based at least in part on determining that the ferroelectric memory cell has reached the fatigue threshold, wherein an amplitude of the second voltage is greater than an amplitude of the first voltage, and wherein the second voltage is applied for a time period or a number of repetitions that is based at least in part on the fatigue threshold of the ferroelectric memory cell.

2. The method of claim 1, further comprising:

determining a logic state of the ferroelectric memory cell based at least in part on determining that the ferroelectric memory cell has reached the fatigue threshold; and storing the logic state of the ferroelectric memory cell in another memory cell, wherein the second voltage is applied to the ferroelectric memory cell after storing the logic state of the ferroelectric memory cell in the other memory cell.

3. The method of claim 2, further comprising:

determining a logic state of the other memory cell after applying the second voltage; and writing the logic state of the other memory cell to the ferroelectric memory cell.

4. The method of claim 1, wherein determining that the ferroelectric memory cell has reached the fatigue threshold comprises:

detecting at least one of:
  a timer exceeding a threshold time period, wherein the threshold time period is based at least in part on a time to reach the fatigue threshold;
  a counter exceeding a threshold number of counts, wherein the counter is incremented for each access cycle of the plurality of access cycles;
  a failure to sense the ferroelectric memory cell based at least in part on applying a test access voltage with an amplitude less than the amplitude of the first voltage;
  a failure to sense the ferroelectric memory cell based at least in part on a test sense window that is less than a sense window used for each cycle of the plurality of access cycles, wherein the test sense window is based at least in part on a reference voltage; or
  an error correction code detecting a corrupted logic value of the ferroelectric memory cell.

5. The method of claim 1, wherein determining that the ferroelectric memory cell has reached the fatigue threshold comprises:

receiving a command to perform a fatigue recovery operation.

6. The method of claim 1, wherein the memory array comprises an element of a device, and wherein applying the second voltage to the ferroelectric memory cell comprises:

applying the second voltage to the ferroelectric memory cell during an event that comprises at least one of:
  the device powering on;
  the device powering off; or
  the device being connected to an external power supply.

7. The method of claim 1, wherein applying the second voltage for the time period or the number of repetitions comprises:

applying the second voltage during a plurality of instances of an event, wherein a subset of the time period or a subset of the number of repetitions is associated with each instance of the event.

8. The method of claim 1, further comprising:

suspending the application of the second voltage based at least in part on receiving a request to access the memory array; and resuming the application of the second voltage based at least in part on completing the request.

9. The method of claim 1, further comprising:

incrementing a counter each time the second voltage is applied.

10. The method of claim 1, further comprising:

applying the second voltage during a refresh operation that restores a logic state to the ferroelectric memory cell, wherein the logic state is determined based at least in part on applying the first voltage.

11. The method of claim 1, wherein the memory array comprises a plurality of rows, wherein each row of the plurality of rows comprises a plate line in electronic communication with a plurality of ferroelectric memory cells, and wherein applying the second voltage comprises:

applying the second voltage to at least one plate line, wherein the second voltage is applied to each ferroelectric memory cell that is in electronic communication with the plate line based at least in part on applying the second voltage to the at least one plate line.

12. The method of claim 11, wherein applying the second voltage to the plate line comprises:

applying the second voltage to a plurality of plate lines.

13. The method of claim 1, wherein the fatigue threshold of the ferroelectric memory cell is based at least in part on a relationship between a charge stored in the ferroelectric memory cell and a capacitance of a digit line in electronic communication with the ferroelectric memory cell and a sense component.

14. The method of claim 13, wherein the fatigue threshold of the ferroelectric memory cell is based at least in part on a total number of access cycles in which the ferroelectric memory cell reaches a remnant polarization threshold.

15. The method of claim 1, further comprising:

determining that a charge stored in the ferroelectric memory cell after applying the second voltage is greater than a charge stored in the ferroelectric memory cell before applying the second voltage, wherein the determination is based at least in part on a sense voltage produced by the ferroelectric memory cell.

16. The method of claim 1, wherein the time period or the number of repetitions of the second voltage is based at least in part on the amplitude of the second voltage.

17. The method of claim 1, wherein applying the first voltage to access the ferroelectric memory cell comprises:

reading the ferroelectric memory cell or writing the ferroelectric memory cell.

18. The method of claim 1, wherein the second voltage comprises at least one of:
  a plurality of bipolar voltage pulses;
  a plurality of unipolar voltage pulses; or
  a voltage with a constant amplitude.

19. A memory device, comprising:

a memory array comprising a plurality of ferroelectric memory cells; and a counter that is resettable based at least in part on a fatigue recovery operation performed on at least one ferroelectric memory cell of the plurality of ferroelectric memory cells.

20. The memory device of claim 19, wherein the memory array comprises a plurality of memory blocks that comprise a subset of the memory array, and wherein each memory block of the plurality is associated with at least one counter.

21. The memory device of claim 19, further comprising:
a controller configured to perform the fatigue recovery operation, wherein the fatigue recovery operation comprises:
   a determination that the at least one ferroelectric memory cell has reached a fatigue threshold based at least in part on applying a first voltage to the at least one ferroelectric memory cell for a plurality of access cycles; and
   a second voltage applied to the at least one ferroelectric memory cell based at least in part on the determination that the at least one ferroelectric memory cell has reached the fatigue threshold, wherein an amplitude of the second voltage is greater than an amplitude of the first voltage, and wherein the second voltage is applied for a time period or a number of repetitions that is based at least in part on the fatigue threshold of the at least one ferroelectric memory cell.

22. The memory device of claim 19, further comprising:
a controller configured to:
   perform the fatigue recovery operation on a first ferroelectric memory cell of the plurality of ferroelectric memory cells; and
   perform an access operation on a second ferroelectric memory cell of the plurality during the fatigue recovery operation of the first ferroelectric memory cell.

23. An electronic circuit, comprising:
a memory array comprising a plurality of ferroelectric memory cells;
a plurality of conductive terminals in electronic communication with the memory array; and
a recovery terminal that supports a fatigue recovery operation of the plurality of ferroelectric memory cells, wherein the plurality of conductive terminals comprises the recovery terminal, and wherein the fatigue recovery operation comprises:
   a recovery voltage applied to at least one ferroelectric memory cell of the plurality based at least in part on a determination that the at least one ferroelectric memory cell has reached a fatigue threshold, wherein an amplitude of the recovery voltage is greater than an amplitude of an access voltage, and wherein the recovery voltage is applied for a time period or a number of repetitions that is based at least in part on the fatigue threshold.

24. The electronic circuit of claim 23, wherein the plurality of conductive terminals comprise:
   a first power terminal in electronic communication with a first voltage supply that comprises the access voltage and is applicable to a ferroelectric memory cell of the memory array during an access operation of the ferroelectric memory cell; and
   a second power terminal in electronic communication with a second voltage supply that comprises the recovery voltage and is applicable to the ferroelectric memory cell of the memory array during the fatigue recovery operation of the ferroelectric memory cell.

25. The electronic circuit of claim 23, wherein the fatigue recovery operation comprises:
   a signal to initiate the fatigue recovery operation of the plurality of ferroelectric memory cells via the recovery terminal.

26. The electronic circuit of claim 23, wherein the fatigue recovery operation comprises parameters that are programmable by a user.

* * * * *